(12) United States Patent
Beffa (10) Patent No.: US 7,952,430 B1
(45) Date of Patent: May 31, 2011

(54) AMPLIFIER CIRCUIT, INTEGRATED CIRCUIT AND RADIO FREQUENCY COMMUNICATION UNIT

(75) Inventor: Federico Alessandro Fabrizio Beffa, Agno (CH)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/010,772

(22) Filed: Jan. 20, 2011

Related U.S. Application Data (63) Continuation-in-part of application No. 12/557,512, filed on Sep. 10, 2009, now Pat. No. 7,902,920.

(51) Int. Cl.
*H03F 3/45* (2006.01)
(52) U.S. Cl. .............. 330/86; 330/260; 330/254
(58) Field of Classification Search ............ 330/86, 330/260, 254
See application file for complete search history.

(56) References Cited

U.S. PATENT DOCUMENTS

| | | | |
|---|---|---|---|
| 4,574,249 A * | 3/1986 | Williams | 330/59 |
| 5,285,169 A * | 2/1994 | Theus | 330/254 |
| 5,999,052 A * | 12/1999 | Tang | 330/254 |
| 6,538,507 B2 * | 3/2003 | Prentice et al. | 330/85 |
| 6,545,534 B1 | 4/2003 | Mehr | |
| 6,724,251 B1 | 4/2004 | Ziazadeh | |
| 7,295,061 B1 * | 11/2007 | Dasgupta | 330/9 |
| 7,358,799 B2 * | 4/2008 | Schrodinger | 327/552 |
| 7,558,014 B1 * | 7/2009 | Voo et al. | 360/67 |
| 7,622,845 B2 | 11/2009 | Micko | |
| 7,657,191 B2 * | 2/2010 | Killmeyer et al. | 398/202 |
| 7,671,774 B2 | 3/2010 | Braswell | |
| 2006/0125557 A1 | 6/2006 | Manstretta | |
| 2007/0176664 A1 | 8/2007 | Bajdechi | |
| 2008/0231357 A1 | 9/2008 | Zolfaghari | |

FOREIGN PATENT DOCUMENTS

| | | |
|---|---|---|
| GB | 765398 | 1/1957 |
| WO | 2008044750 A1 | 4/2008 |
| WO | 2009046349 A1 | 4/2009 |

OTHER PUBLICATIONS

Bagheri, "An 800-MHz-6-GHz Software-Defined Wireless Receiver in 90-nm CMOS," IEEE Journal of Solid-State Circuits, vol. 41, No. 12, Dec. 2006.
Bruccoleri, "Noise Cancelling in Wideband CMOS LNAs," ISSCC 2002/ Session 24/ RF Systems/ 24.6, 2002.
Tenbroek, "Single-Chip Tri-Band WCDMA/HSDPA Transceiver without External Saw Filters and with Integrated TX Power Control," ISSCC 2008/ Session 10/ Cellular Transceivers/ 10.2, pp. 202-203, 607, 2008.

* cited by examiner

*Primary Examiner* — Patricia Nguyen
(74) *Attorney, Agent, or Firm* — Winston Hsu; Scott Margo (57) ABSTRACT

An amplifier circuit for amplifying a differential input signal includes a first feedback resistance, a second feedback resistance, first transconductance circuitry, and second transconductance circuitry. The first feedback resistance is connected between a first input node and a first output node of the amplifier circuit. The second feedback resistance is connected between a second input node and a second output node of the amplifier circuit. The first transconductance circuitry is arranged to inject a transconductance current at a point along the first feedback resistance, and is configurable to vary the point along the first feedback resistance where the transconductance current is injected. The second transconductance circuitry is arranged to inject another transconductance current at a point along the second feedback resistance, and is configurable to vary the point along the second feedback resistance where the another transconductance current is injected.

25 Claims, 9 Drawing Sheets

AMPLIFIER CIRCUIT, INTEGRATED CIRCUIT AND RADIO FREQUENCY COMMUNICATION UNIT

CROSS REFERENCE TO RELATING APPLICATIONS

This continuation-in-part application claims the benefit of co-pending U.S. patent application Ser. No. 12/557,512, filed on Sep. 9, 2009 and incorporated herein by reference.

BACKGROUND

The field of this invention relates to an amplifier circuit, an integrated circuit and a radio frequency communication unit comprising such an amplifier circuit and/or integrated circuit. The invention is particularly applicable to, but not limited to, a variable gain low noise amplifier circuit.

In the field of radio frequency (RF) communication receivers, the main task of the receiver front-end circuit is to process a signal that is received by an antenna coupled to the receiver front-end circuit in such a manner that it can be more easily processed by subsequent receiver circuits, for example, demodulation circuitry. Typically, such front-end circuits comprise low noise amplifier (LNA) circuitry for amplifying the received RF signal, and mixer circuitry arranged to perform frequency translation of the amplified radio frequency signal to a lower intermediate or baseband frequency. The intermediate/baseband frequency signal may then be filtered to remove interfering signals, etc.

Since the frequency of the intermediate or baseband signal output by the mixer circuitry is typically much lower than the carrier frequency ($f_{RF}$) for the received RF signal, all stages within the receive chain subsequent to the mixer circuitry operates at low or baseband frequencies. Furthermore, due to the amplification provided by the LNA circuitry in front of the mixer circuitry, and by the mixer circuitry itself (if active mixers are used), the signal levels following the mixer circuitry are also larger than the signal level of the received RF signal. Accordingly, these low frequency/high signal level characteristics allow the use of a large variety of circuit techniques for the implementation of the stages within the receive chain following the front-end circuitry.

However, due to the high operating frequencies and the low signal levels of the received RF signal, only a very limited number of circuit techniques may be used to successfully implement the front-end circuitry that comprises the LNA circuitry and the mixer circuitry. The primary challenge in the design of an LNA circuit is to minimise noise. However, LNA circuitry within an RF receiver also has to provide a sufficiently large gain, a well defined input impedance, and has to introduce very little distortion (e.g. the performance of the LNA should be designed to be as linear as possible). Hence, one of the most important LNA linearity metrics is the IP3 (third order intercept point).

Figure 1:
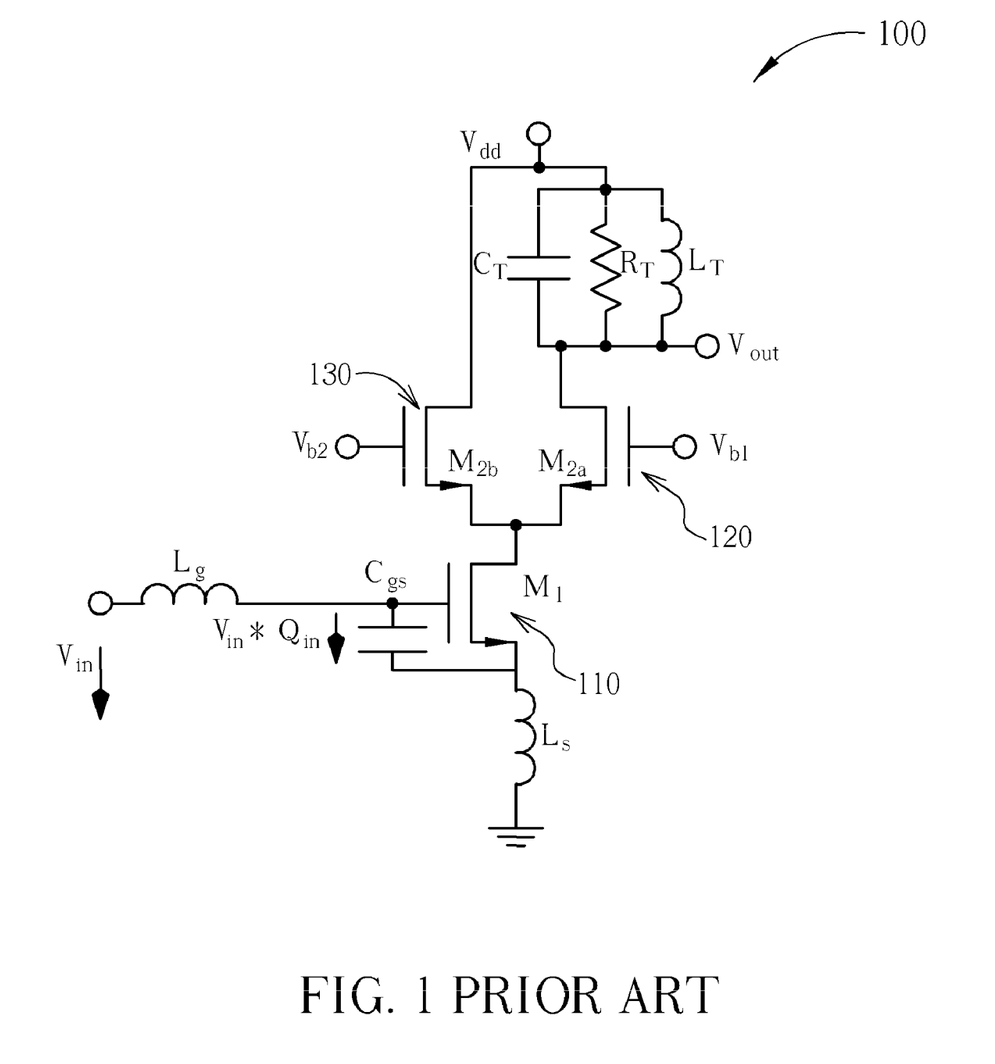
FIG. 1 illustrates an example of a known low noise amplifier topology.

Referring now to FIG. 1, there is illustrated an example of a known LNA circuit topology 100, comprising an inductively degenerated amplifier. The LNA circuit topology 100 illustrated in FIG. 1 exploits the voltage gain provided by a series RLC resonance circuit to boost the voltage appearing between the gate and the source of the input device. This voltage amplification provides two advantages: firstly it provides amplification before the first noisy component of the amplifier, namely transistor M1 110; and secondly the effective transconductance of the amplifier input stage is increased by a factor 'Q' compared to the transconductance of transistor M1 110, where 'Q' is the quality factor of the input series resonance. The effect of providing such amplification before the first noisy component of the amplifier is a net reduction in the noise contributed by the amplifier over the total noise appearing at the output of the amplifier. Furthermore, the consequence of the increase of the effective transconductance of the amplifier input stage is a reduced current consumption for a given desired gain.

However, since the input stage is built around a resonant circuit, the input stage operates over relatively narrow bandwidths and, thus, has to be tuned differently for different frequency bands. In order to accommodate a large dynamic range, such as that required for modern communication receivers, the LNA circuitry is typically required to provide two or more gain settings. For the amplifier topology illustrated in FIG. 1, programmable gain settings are implemented by way of splitting the signal current using cascode transistors $M_{2a}$ 120 and $M_{2b}$ 130 such that, in all but the maximum gain setting, only part of the signal current reaches the output of the amplifier.

A problem with this approach is that it is inefficient in terms of current consumption, particularly at low gain settings. Accordingly, a desirable feature would be to be able to reduce the current consumption in the low gain settings. However, implementing any form of current reduction technique would change the transconductance of transistor M1 110. Since the input impedance of the amplifier topology 100 at resonance is real, and is proportional to the transconductance of transistor M1 110, such a current reduction would result in a change in the input impedance of the amplifier, which would cause a mismatch with, for example, an antenna coupled thereto.

A further problem with the amplifier topology 100 of FIG. 1 is that it exhibits a poor linearity performance. The voltage amplification provided by the input resonance circuit increases the gate-source voltage swing of transistor M1 110. Whilst this may be beneficial in terms of noise, it also increases the distortion introduced by transistor M1 110.

Figure 2:
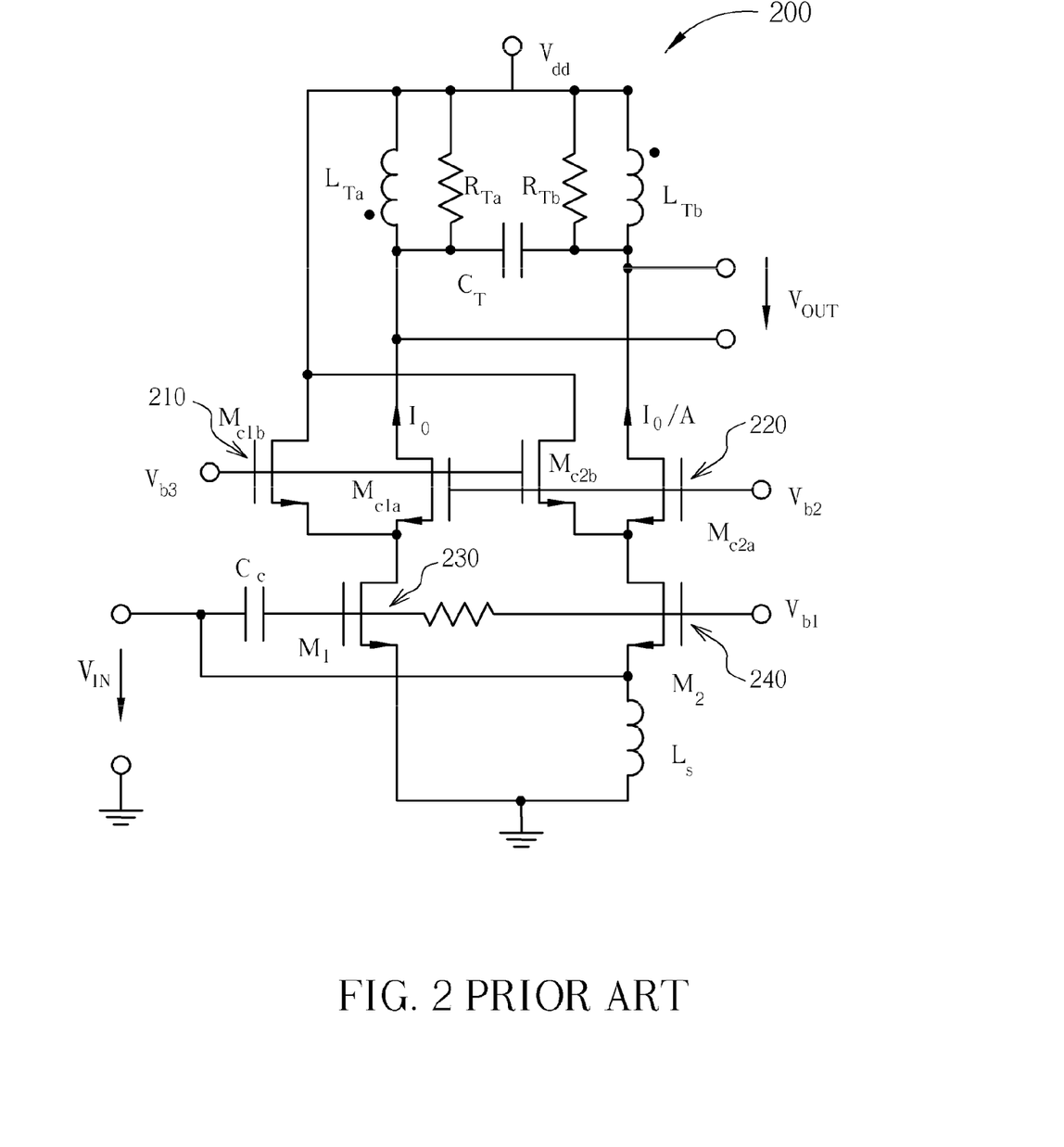
FIG. 2 illustrates an example of a further known low noise amplifier topology.

An alternative example of a known LNA circuit topology comprises a common-gate configuration. A problem with a traditional common-gate amplifier topology is that the theoretical best noise figure (NF) achievable is limited to 2.2 dB. The achievable noise figure is limited by the fact that the transconductance of the input device not only defines the noise characteristic of the amplifier, but it also determines its input impedance. A better noise figure can typically only be achieved by using reactive impedance transformations. This circuit configuration is therefore only used in receivers with relatively relaxed noise requirements. However, FIG. 2 illustrates an example of a recently proposed common-gate amplifier topology 200 in which the noise performance of the common-gate stage is improved. For the illustrated example, a common-source stage, comprising transistors $M_{c1b}$ 210 and $M_{c2b}$ 220, is connected in parallel with the common-gate stage, comprising transistors M1 230 and M2 240. If the transistors are properly sized, the noise of the common-gate transistor appears as a common-mode signal at the output of the amplifier, and can therefore be suppressed. The main noise contributor is then the common-source stage, which can be designed to have a higher transconductance than its common-gate counterpart. The higher transconductance common-source stage, together with the cancelling of the noise generated by the common-gate stage, result in an amplifier with an improved noise figure. However, the noise performance of such an amplifier topology 200 of FIG. 2 is still unable to match that of the inductively degenerated amplifier topology 100 of FIG. 1.

Nevertheless, an advantage of the amplifier topology 200 of FIG. 2 is that it converts a single ended input signal into a differential signal at the input of amplifier. A differential signal enables improved dynamic range, reduced sensitivity to supply voltage and substrate noise, improved isolation, etc. within, for example, a receiver chain of which the amplifier forms a part.

The input impedance of the amplifier topology 200 of FIG. 2 is broadband and is equal to the reciprocal of the transconductance of transistor M2 240. Accordingly, in the same manner as for the inductively degenerated amplifier of FIG. 1, the current cannot be reduced in the low gain modes, as this would modify the input impedance of the amplifier circuit. Gain control is therefore usually implemented with the help of cascode transistors in the same manner as described for the inductively degenerated amplifier of FIG. 1.

Figure 3:
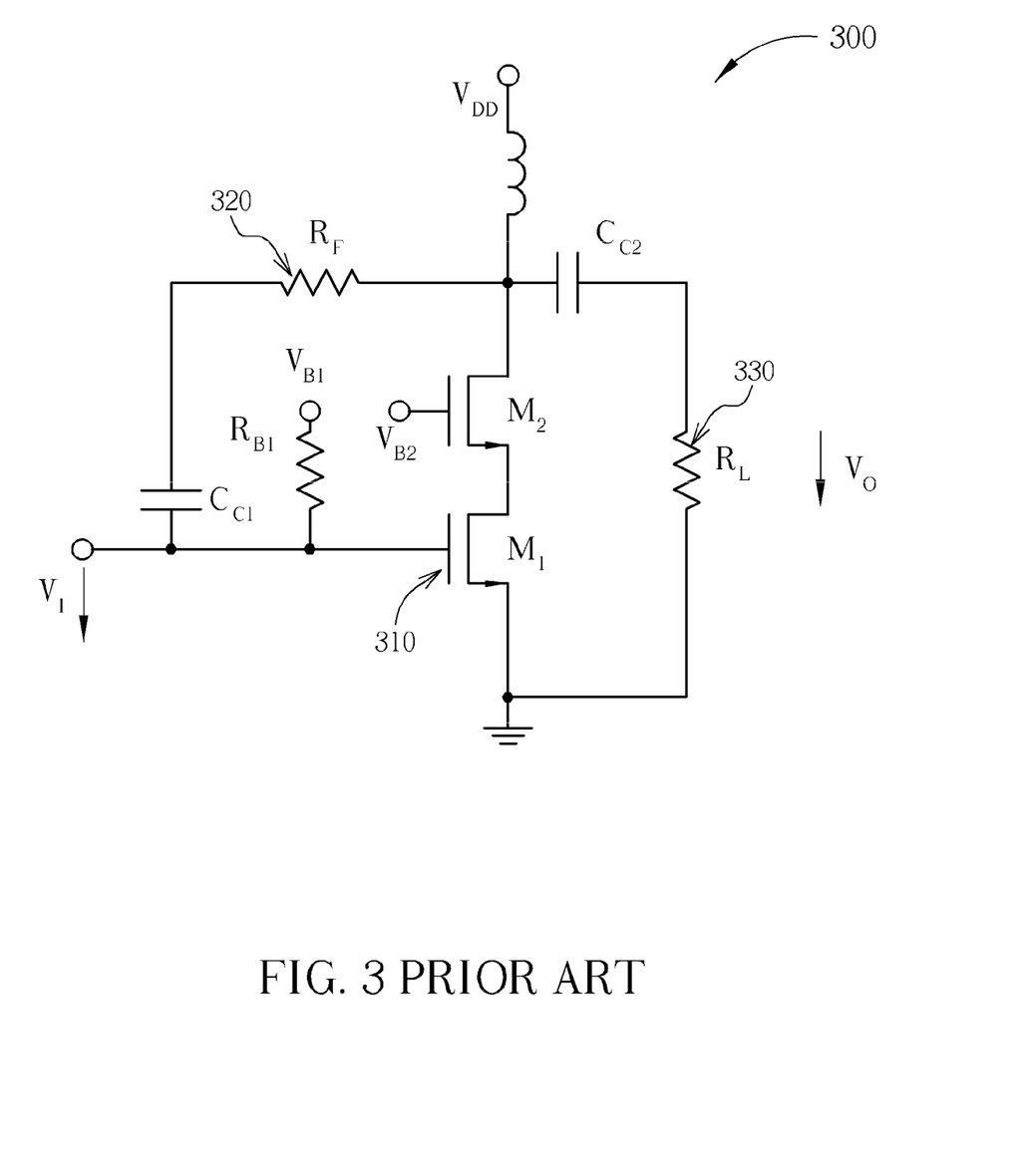
FIG. 3 illustrates an example of a still further known low noise amplifier topology.

Referring now to FIG. 3, there is illustrated a further example of an amplifier topology 300 that is suitable for the implementation of an LNA, where the amplifier topology 300 comprises a shunt-shunt feedback amplifier. However, this configuration is not popular for the implementation of highly integrated receivers for mobile applications for two main reasons. Firstly, for proper operation the transconductance of transistor M1 310 has to be quite large (>100 mS), resulting in the amplifier, and in particular implementations comprising MOSFETs, being power hungry. Secondly, no straightforward way of implementing various gain settings has been proposed, as both the gain and the input impedance of the amplifier are functions of the feedback resistor $R_F$ 320, of the load resistor $R_L$ 330 and of the transconductance of M1 in a non-trivial way.

In addition to the above identified short comings of the prior art topologies, analogue circuits comprising components, such as inductors, are unable to scale and provide comparable improvements in integrated circuit manufacturing processes in the same manner as digital circuits. Instead, scaling of analogue circuits must be achieved by innovation and new design and circuit techniques.

Thus, a need exists for an improved amplifier circuit, integrated circuit and radio frequency communication unit that may alleviate one or more of the aforementioned problems of known amplifier circuits.

SUMMARY

Accordingly, the invention seeks to mitigate, alleviate or eliminate one or more of the above mentioned disadvantages either singly or in any combination. Aspects of the invention provide an amplifier circuit, an integrated circuit and a radio frequency communication device comprising such an amplifier circuit, as described in the appended claims.

According to a first aspect of the invention, there is provided an amplifier circuit for amplifying a differential input signal received at a first input node and a second input node thereof. The amplifier circuit comprises a first feedback resistance connected between the first input node of the amplifier circuit and a first output node thereof, first transconductance circuitry arranged to inject a transconductance current at a point along the first feedback resistance, a second feedback resistance connected between the second input node of the amplifier circuit and a second output node thereof, and second transconductance circuitry arranged to inject another transconductance current at a point along the second feedback resistance. The first transconductance circuitry is configurable to vary the point along the first feedback resistance where the transconductance current is injected. The second transconductance circuitry is configurable to vary the point along the second feedback resistance where the another transconductance current is injected. By way of example, but not limitation, the amplifier circuit may be a pseudo-differential amplifier or a fully-differential amplifier.

In this manner, regarding each feedback resistance that is located within feedback loops in a positive half-circuit and a negative half-circuit of the pseudo-differential/fully-differential amplifier, a resistive value of the feedback resistance may be reduced by an amount $\Delta R_F$ for low gain settings. Additionally, that part of the feedback resistance that is no longer present within the feedback loop becomes coupled in series with a load resistance ($R_{LO}$) for the amplifier circuitry, and as such the effective load resistance becomes increased by a corresponding amount, namely $\Delta R_F$. Accordingly, by shifting the point at which the transconductance current is injected, the gain of the amplifier may be varied in a controllable manner.

According to an optional feature of the invention, the first transconductance circuitry is configured to adjust the point along the first feedback resistance at which the transconductance current is injected and the second transconductance circuitry is configured to adjust the point along the second feedback resistance at which the another transconductance current is injected such that a constant input impedance of the amplifier circuit is maintained.

According to an optional feature of the invention, each of the first transconductance circuitry and the second transconductance circuitry is implemented using a complementary stage arrangement. In this manner, current consumption may be reduced and the noise figure of the amplifier circuitry may be improved. For example, each of the first transconductance circuitry and the second transconductance circuitry may comprise a first complementary stage and at least one further complementary stage where the transconductance circuitry may be arranged to inject a first transconductance current provided by said first complementary stage at a first point along a corresponding feedback resistance.

According to an optional feature of the invention, the at least one further complementary stage may be arranged to inject an at least one further transconductance current provided by said at least one further complementary stage at an at least one further point along the corresponding feedback resistance.

In accordance with an optional feature of the invention, the first transconductance current from the first complementary stage may be injected into the corresponding feedback resistance by way of a first common-gate transistor stage and at least one further common-gate transistor stage.

In accordance with an optional feature of the invention, at least one further transconductance current from the at least one further complementary stage may be injected into the corresponding feedback resistance by way of at least one still further common-gate transistor stage.

According to an optional feature of the invention, each complementary stage may comprise a pair of complementary metal oxide semiconductor field effect transistors.

According to an optional feature of the invention, the amplifier circuit may be adapted for use in a broadband radio frequency front-end circuitry.

According to a second aspect of the invention, there is provided an integrated circuit comprising the amplifier circuit of the first aspect of the invention.

According to a third aspect of the invention, there is provided a radio frequency communication unit comprising the amplifier circuit of the first aspect of the invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of radio frequency (RF) communication receiver front-end low noise amplifier (LNA) circuitry. However, it will be appreciated by a skilled artisan that the inventive concept herein described may be embodied in any type of amplifier circuitry. In a number of applications, amplifier circuitry adapted in accordance with the examples of the invention effectively performs variable gain low noise amplification of a received signal without the need for on-chip analogue components, such as inductor coils or the like, whilst enabling a reduction in current consumption for low gain configurations. In this manner, power consumption of the LNA for low gain configurations, may be reduced, and the scalability of semiconductor components such as transistors resulting from improvements in semiconductor manufacturing processes may be taken advantage of.

The term 'complementary stage arrangement' hereinafter used encompasses the general use of a complementary stage transistor circuit. The term, 'complementary stage configuration' hereinafter used encompasses how a transistor-based amplifier circuit, using a complementary stage transistor arrangement can be configured to provide different complementary stage characteristics.

Figure 4:
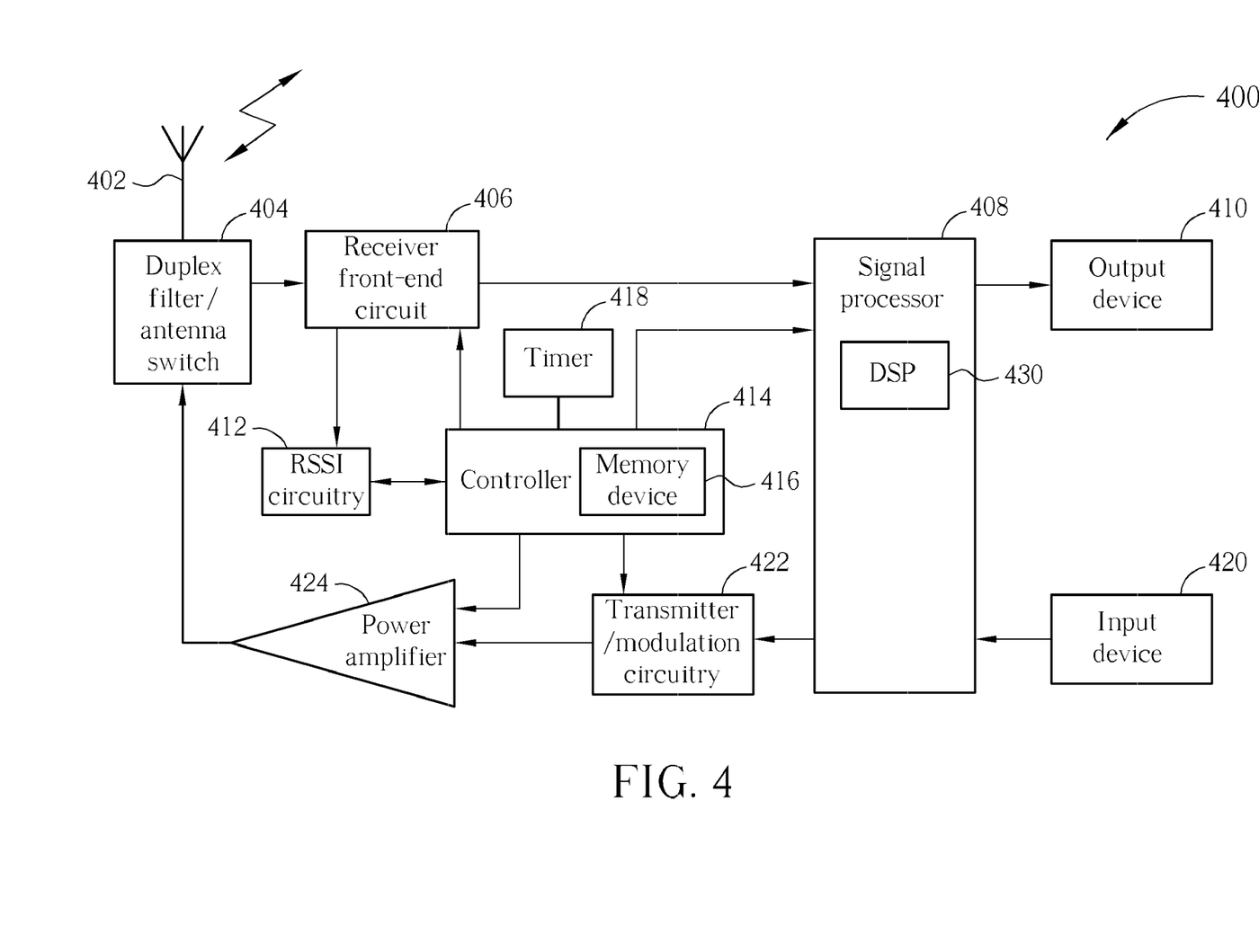
FIG. 4 illustrates a block diagram of an example of a radio frequency communication unit that may be adapted to use an amplifier circuit according to embodiments of the invention.

Referring first to FIG. 4, a block diagram of an example of a radio frequency (RF) communication unit (sometimes referred to as a mobile subscriber unit (MS) in the context of cellular communications or a user equipment (UE) in terms of a $3^{rd}$ generation partnership project (3GPP) communication system) is shown, in accordance with one embodiment of the invention. However, the examples of amplifier circuits later described may be implemented in any wireless communication unit. The RF communication unit, or MS, 400 contains an antenna 402 preferably coupled to a duplex filter or antenna switch 404 that provides isolation between receive and transmit chains within the MS 400.

The receiver chain, as known in the art, includes receiver front-end circuit 406 (effectively providing reception, filtering and intermediate or base-band frequency conversion). The front-end circuit 406 is serially coupled to a signal processor 408. An output from the signal processor 408 is provided to a suitable output device 410, such as a screen or flat panel display. The receiver chain also includes received signal strength indicator (RSSI) circuitry 412, which in turn is coupled to a controller 414 that maintains overall communication unit control. The controller 414 may therefore receive bit error rate (BER) or frame error rate (FER) data from recovered information. The controller 414 is also coupled to the receiver front-end circuit 406 and the signal processor 408 (generally realised by a digital signal processor (DSP) 430). The controller is also coupled to a memory device 416 that selectively stores operating regimes, such as decoding/encoding functions, synchronisation patterns, code sequences, RSSI data, and the like. A timer 418 is operably coupled to the controller 414 to control the timing of operations (transmission or reception of time-dependent signals) within the MS 400.

As regards the transmit chain, this essentially includes an input device 420, such as a keypad, coupled in series through transmitter/modulation circuitry 422 and a power amplifier 424 to the antenna 402. The signal processor 408 in the transmit chain may be implemented as distinct from the processor in the receive chain. Alternatively, a single processor 408 may be used to implement processing of both transmit and receive signals, as shown in FIG. 4. Clearly, the various components within the MS 400 can be realised in discrete or integrated component form, with an ultimate structure therefore being merely an application-specific or design selection.

Figure 5:
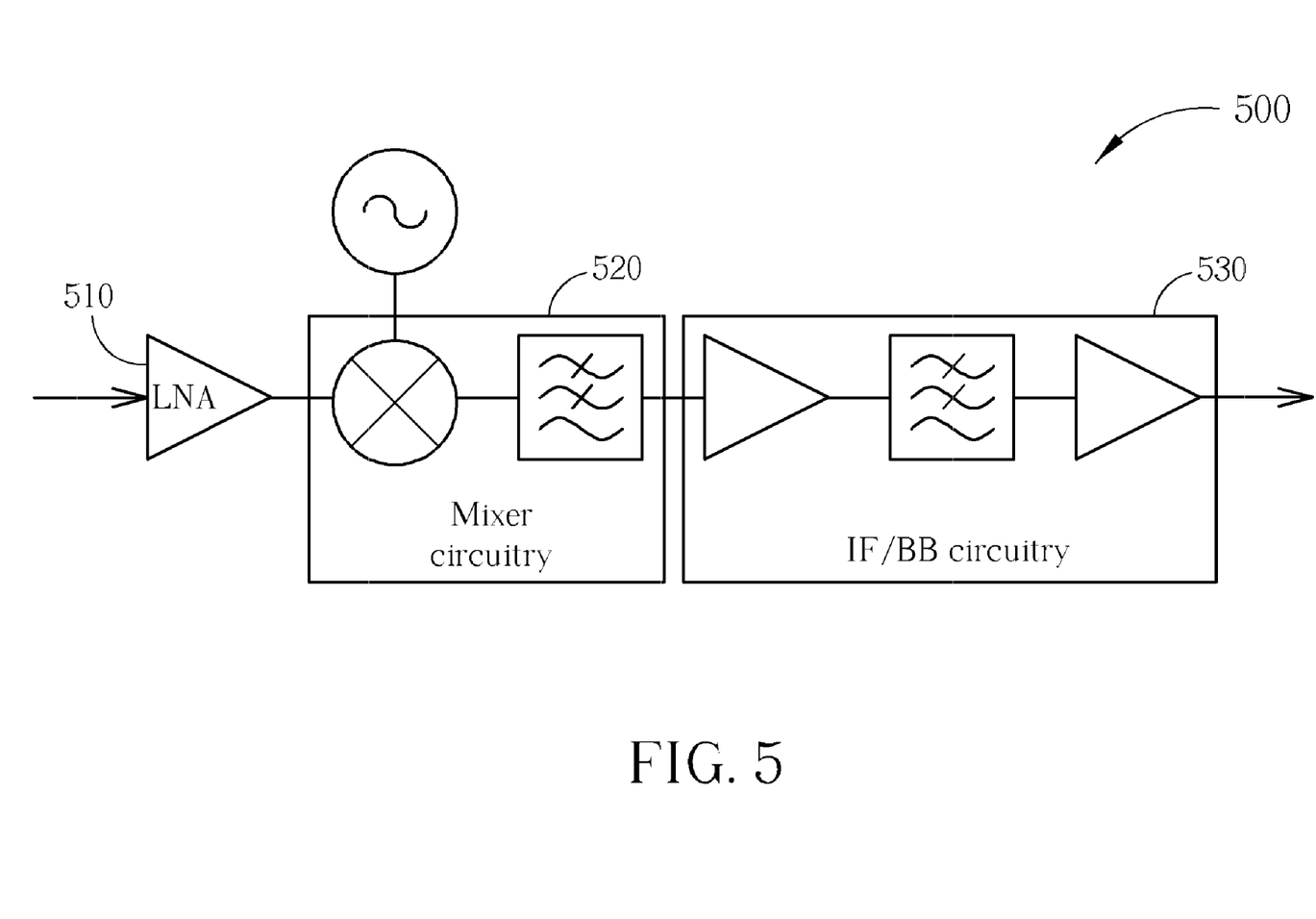
FIG. 5 illustrates an example of generic front-end receiver circuitry.

Referring now to FIG. 5, there is illustrated an example of generic front-end receiver circuitry 500, such as may be used to implement the front-end circuit 406 of the MS 400 of FIG. 4. The front-end circuitry 500 comprises low noise amplifier (LNA) 510 for amplifying a received RF signal, for example as would be received by antenna 402 of MS 400. The front-end circuitry 500 further comprises mixer circuitry 520 arranged to perform frequency translation of the received amplified signal output by LNA 510 to a lower intermediate or baseband frequency signal. The intermediate/baseband frequency signal is then filtered and further processed by intermediate or baseband frequency circuitry (IF/BB circuitry) 530.

Figure 6:
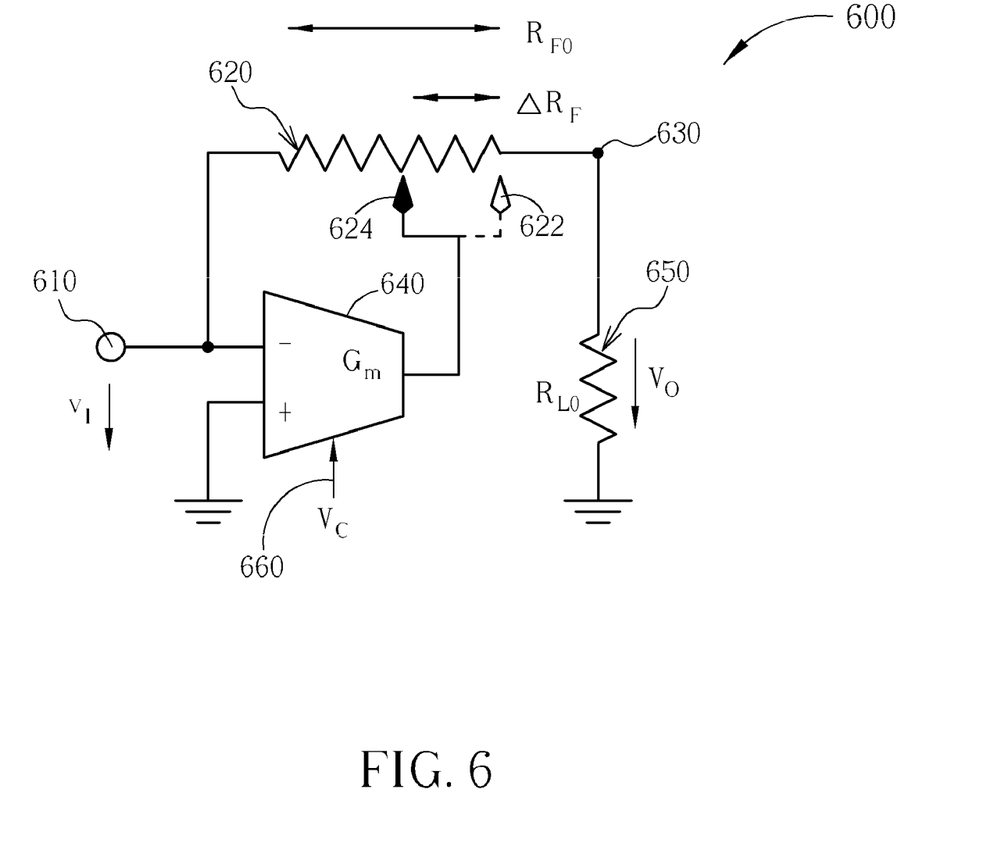
FIG. 6 illustrates an example of a simplified diagram of an amplifier circuit according to some embodiments of the present invention.

Referring now to FIG. 6, there is illustrated an example of a simplified diagram of an amplifier circuit 600 for amplifying an input signal received at an input 610 thereof, such as may be used to implement the LNA 510 of FIG. 5. For the illustrated example, the amplifier circuit 600 is based on a shunt-shunt feedback topology and comprises a feedback resistance 620 connected between the input 610 of the amplifier circuit and an output node 630 thereof. The amplifier circuit 600 further comprises transconductance circuitry 640 arranged to inject a transconductance current for the received input signal at a point along the feedback resistance 620, said transconductance current being based on a voltage level at the input 610 of the amplifier circuit for the illustrated example. In particular, the transconductance circuitry 640 is configurable to vary the point along the feedback resistance 620 where the transconductance current is injected.

For example, the transconductance circuitry 640 of FIG. 6 is arranged to inject a transconductance current at a first point 622 along the feedback resistance 620 when in a first configuration, for example during high gain configuration, whereby the first point 622 along the feedback resistance 620 is located generally adjacent to the output node 630 of the amplifier circuit 600. In this manner, a large proportion of the resistive value, which for the illustrated example comprises substantially the full resistive value ($R_{F0}$), of the feedback resistance 620 is present within the feedback loop, thereby resulting in a high gain for the amplifier. The transconductance circuitry 640 may be further arranged to inject a transconductance current at an at least one further point 624 along the feedback resistance 620 when operating in an at least one further configuration, for example during a reduced gain configuration, whereby the at least one further point 624 along the feedback resistance 620 is located toward the input 610 of the amplifier circuit relative to the first point 622. In this manner, the resistive value of the feedback resistance 620 that is present within the feedback loop is reduced by an amount $\Delta R_F$. Additionally, that part of the feedback resistance that is no longer present within the feedback loop becomes coupled in series with a load resistance ($R_{L0}$) 650 for the amplifier circuitry, and as such the effective load resistance 650 becomes increased by a corresponding amount, namely $\Delta R_F$. Accordingly, by shifting the point at which the transconductance current is injected from the first point 622 to the second point 624, the gain of the amplifier is reduced.

As will be appreciated by a skilled artisan, the gain of an amplifier circuit, such as that illustrated in FIG. 6, is a function of both the feedback resistance 620 and the load resistance 650, along with the transconductance ($G_m$) provided by transconductance circuitry 640. Thus, by varying the point at which the transconductance current is injected into the feedback resistance 620, the effective values of both the resistance within the feedback loop and the output resistance may be modified to vary the gain of the amplifier circuit.

The input impedance of an amplifier circuit, such as that illustrated in FIG. 6, is also a function of the feedback resistance 620, the load resistance 650, and the transconductance ($G_m$) provided by transconductance circuitry 640. Accordingly, for the illustrated embodiment the transconductance circuitry 640 may be further arranged to adjust the transconductance ($G_m$) of the amplifier circuit by controlling the point along the feedback resistance 620 at which the transconductance current is injected. In this manner, the transconductance may be adjusted, such that a substantially constant input impedance of the amplifier circuit 600 may be maintained, irrespective of the point along the feedback resistance 620 at which the transconductance current is injected. Advantageously, for a lower-gain configuration, whereby the value of the feedback resistance within the feedback loop is reduced whilst the effective load resistance is increased, a lower transconductance current is required in order to maintain the constant input impedance. Accordingly, during lower-gain configurations the overall power consumption of the amplifier circuitry is reduced, thereby providing a significant benefit for implementations where power consumption is an important design factor.

For the example illustrated in FIG. 6, the point at which the transconductance current is injected into the feedback resistance, and the transconductance ($G_m$) of the transconductance circuitry 640, is controllable by way of a control voltage $V_c$ 660.

Figure 7:
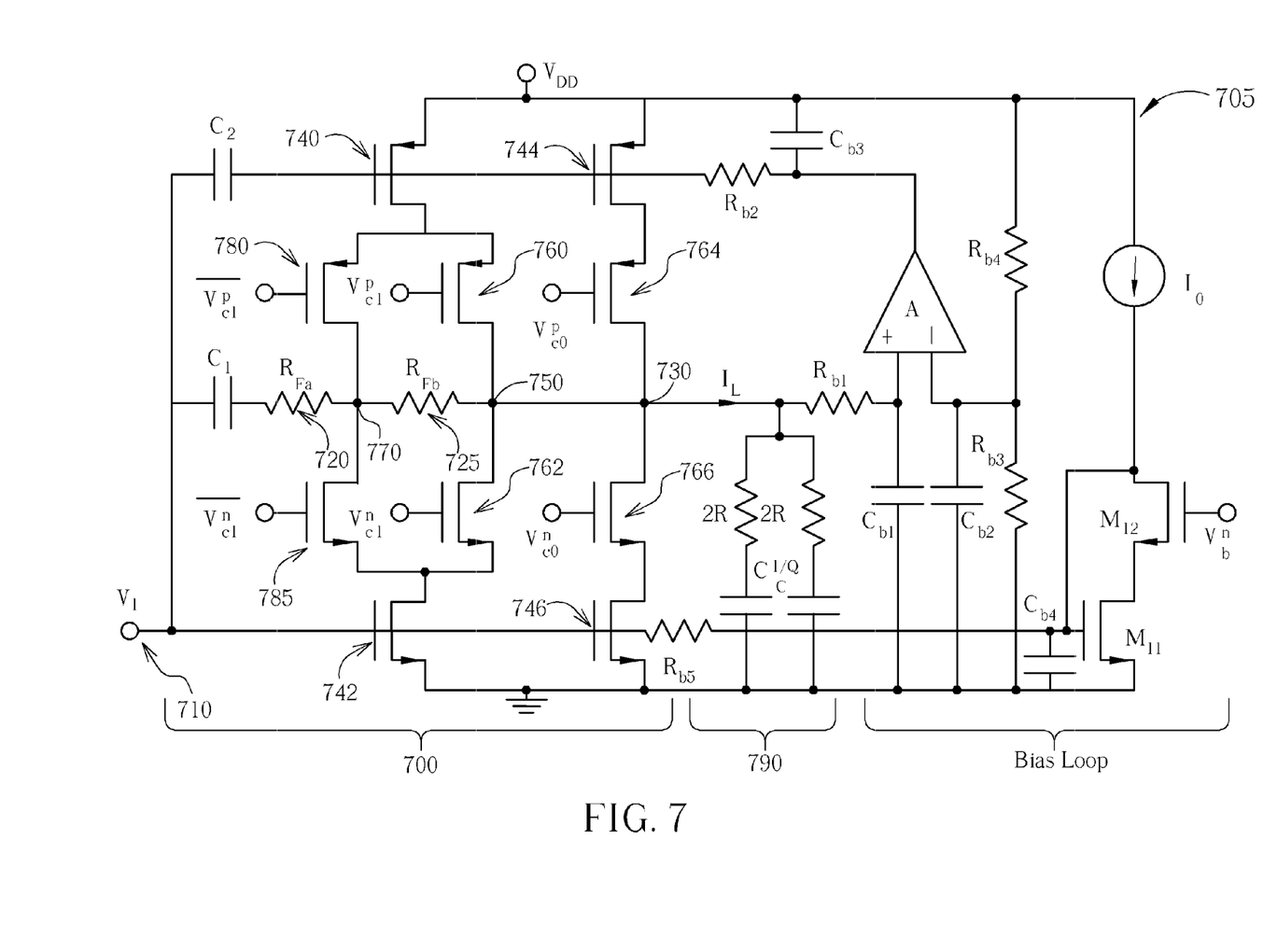
FIG. 7 illustrates an example of an amplifier circuit adapted according to some embodiments of the invention.

Referring now to FIG. 7 there is illustrated an example of a more detailed implementation of an amplifier circuit 700, adapted in accordance with some embodiments of the invention. For the example illustrated in FIG. 7, the amplifier circuit 700 forms part of a receiver front-end circuit provided within an integrated circuit 705. The amplifier circuit 700 comprises feedback resistance in a form of a first feedback resistor $R_{Fa}$ 720 and a second first feedback resistor $R_{Fb}$ 725 connected in series with one another between an input 710 of the amplifier circuit 700 and an output node 730 of the amplifier circuit 700.

The amplifier circuit 700 further comprises transconductance circuitry arranged to inject a transconductance current at a point along the feedback resistance 720, 725, and configurable to vary the point along the feedback resistance at which the transconductance current is injected. For the example illustrated in FIG. 7, the transconductance circuitry is implemented using a complementary stage arrangement to reduce current consumption of the amplifier circuitry 700. The power consumption is reduced by use of a complementary stage as, for a given required total transconductance, the complementary circuit is implemented using two sub-circuits. For example, one sub-circuit is implemented with p-MOSFET devices and the other one with n-MOSFET. The two sub-circuits can be stacked one on top of the other between supply and ground, thereby sharing the same bias current. In a different example, a non-complementary implementation can be thought of as a parallel connection of two parts, each one requiring its own, non-shareable amount of current. In addition, the noise figure of the amplifier circuitry 700 can be improved by using a complementary stage arrangement, since for a total given current for a complementary stage it is possible to achieve a larger total transconductance. This can be exploited to obtain a lower noise figure.

More particularly for the illustrated example, the transconductance circuitry comprises a first complementary stage configuration comprising transistors 740 and 742, and a second complementary stage comprising transistors 744 and 746. The transconductance circuitry is arranged to inject a first transconductance current provided by said first complementary stage configuration at a first point along the feedback resistance 720, 725, illustrated generally at node 750, and located generally adjacent to the output node 730 of the amplifier circuit 700. For clarity purposes only, nodes 730 and 750 have been illustrated in FIG. 7 as being separate. However, in practice, these nodes 730, 750 may be arranged to form a single common node. The first transconductance current from the first complementary stage configuration is injected into the feedback resistance 720, 725 at node 750 by way of two common-gate transistor stages comprising transistors 760, 762 and 764, 766 respectively. Accordingly, when the transconductance circuitry is configured to inject the first transconductance current from the first complementary stage configuration into the feedback resistance at node 750, transistor gate voltages $V_{c1}^P$, $V_{c1}^N$, $V_{c0}^P$ and $V_{c0}^N$ for transistors 760, 762 and 764, 766 respectively are set at potentials that are suitable for switching the respective transistors 'ON', thereby operably coupling the first and second complementary stages comprising transistors 740, 742 and 744, 746 respectively to node 750. Accordingly, when the transconductance circuitry is arranged to operate in this first configuration, the transconductance ($G_m$) of the transconductance circuitry is equal to the sum of the transconductances for transistors 740, 742, 744 and 746. Furthermore, the resistance within the feedback loop comprises the sum of feedback resistors $R_{Fa}$ 720 and $R_{Fb}$ 725.

The transconductance circuitry for the illustrated example further comprises a second complementary stage configuration comprising only the first complementary stage provided by transistors 740 and 742. The transconductance circuitry is arranged to inject a second transconductance current provided by said second complementary stage configuration at a second point along the feedback resistance 720, 725, illustrated generally at node 770, and located toward the input 710 of the amplifier circuit relative to the first node 750. The second transconductance current from the second complementary stage configuration is injected into the feedback resistance 720, 725 at node 770 by way of a further common-gate transistor stage comprising transistors 780, 785. Transistors 780, 785 are arranged to receive at their gates, the inverse of the gate voltages for transistors 760, 762 respectively, illustrated by $\overline{V_{c1}^{P}}$ and $\overline{V_{c1}^{N}}$ in FIG. 7.

Accordingly, when the transconductance circuitry is arranged to operate in the first configuration described above, whilst the gate voltages $V_{c1}^{P}$, $V_{c1}^{N}$, $V_{c0}^{P}$ and $V_{c0}^{N}$ for transistors 760, 762 and 764, 766 respectively are set at potentials that are suitable for switching the respective transistors 'ON', the gate voltages $\overline{V_{c1}^{P}}$ and $\overline{V_{c1}^{N}}$ for transistors 780 and 785 are set at potentials that are suitable for switching the respective transistors 'OFF', thereby effectively isolating node 770 from the first complementary stage provided by transistors 740 and 742. However, when the transconductance circuitry is arranged to operate in the second configuration, the gate voltages $V_{c1}^{P}$, $V_{c1}^{N}$, $V_{c0}^{P}$ and $V_{c0}^{N}$ for transistors 760, 762 and 764, 766 respectively are set at potentials that are suitable for switching the respective transistors 'OFF, thereby effectively isolating node 750 from the first and second complementary stages provided by transistors 740, 742, 744, 746.

Meanwhile, the gate voltages $\overline{V_{c1}^{P}}$ and $\overline{V_{c1}^{N}}$ for transistors 780 and 785 are set at potentials that are suitable for switching the respective transistors 'ON', thereby operably coupling node 770 to the first complementary stage provided by transistors 740 and 742. Accordingly, when the transconductance circuitry is substantially arranged to operate in this second configuration, the transconductance ($G_m$) of the transconductance circuitry is equal to the sum of the transconductances for transistors 740 and 742 only. Furthermore, the resistance within the feedback loop comprises only the first feedback resistor $R_{Fa}$ 720, with the second feedback resistor $R_{Fb}$ 725 becoming coupled in series with a load of the amplifier circuit 700, which for the illustrated example comprises mixer circuitry 790.

As can be seen, the amplifier circuit 700 of FIG. 7 is inductor-less. Such an inductor-less arrangement is now able to be implemented due to the development of nanometer scale semiconductor technology, which results in very fast transistors comprising significantly reduced parasitic capacitances. Whilst the renunciation of inductors in this manner leads to a relatively high current consumption when the amplifier circuit 700 is configured for maximum gain, the reduction in current consumption at the lower gain configuration has been found to be significant enough to sufficiently counter the high current consumption at high gain to thereby make the average current consumption acceptable. Significantly, the removal of inductors from the amplifier circuit enables significant savings in terms of area within an integrated circuit, and improvements in semiconductor and integrated circuit manufacturing processes may be fully exploited.

Another advantageous feature of the amplifier circuit 700 of FIG. 7 is that it does not require external matching components. Well-known feedback techniques may be used to directly generate the required real input impedance for the amplifier circuit 700 of FIG. 7. This is in contrast to, for example, inductively degenerated LNAs that require an inductor connected to the input transistor in order to obtain a real impedance.

In addition to a single-ended implementation, the inventive concept of the present invention may be applied to a pseudo-differential implementation and a fully-differential implementation. Please refer to FIG. 8, which illustrates an exemplary embodiment of a pseudo-differential amplifier 800. By way of example, but not limitation, the exemplary pseudo-differential amplifier 800 may be a pseudo-differential implementation of the LNA. In this exemplary pseudo-differential implementation, the pseudo-differential amplifier 800 amplifies a differential input signal, including $V_{Ip}$ and $V_{In}$, received at a positive input node 810 and a negative input node 820 of the pseudo-differential amplifier 800, and accordingly generates amplifier outputs $V_{Op}$ and $V_{On}$ at a positive output node 830 and a negative output node 840. That is, one of a first input node and a second input node configured for receiving the differential input signal is a positive input node, and the other of the first input node and the second input node is a negative input node. In addition, one of a first output node and a second output node configured for outputting the amplifier outputs is a positive output node, and the other of the first output node and the second output node is a negative output node.

Figure 8:
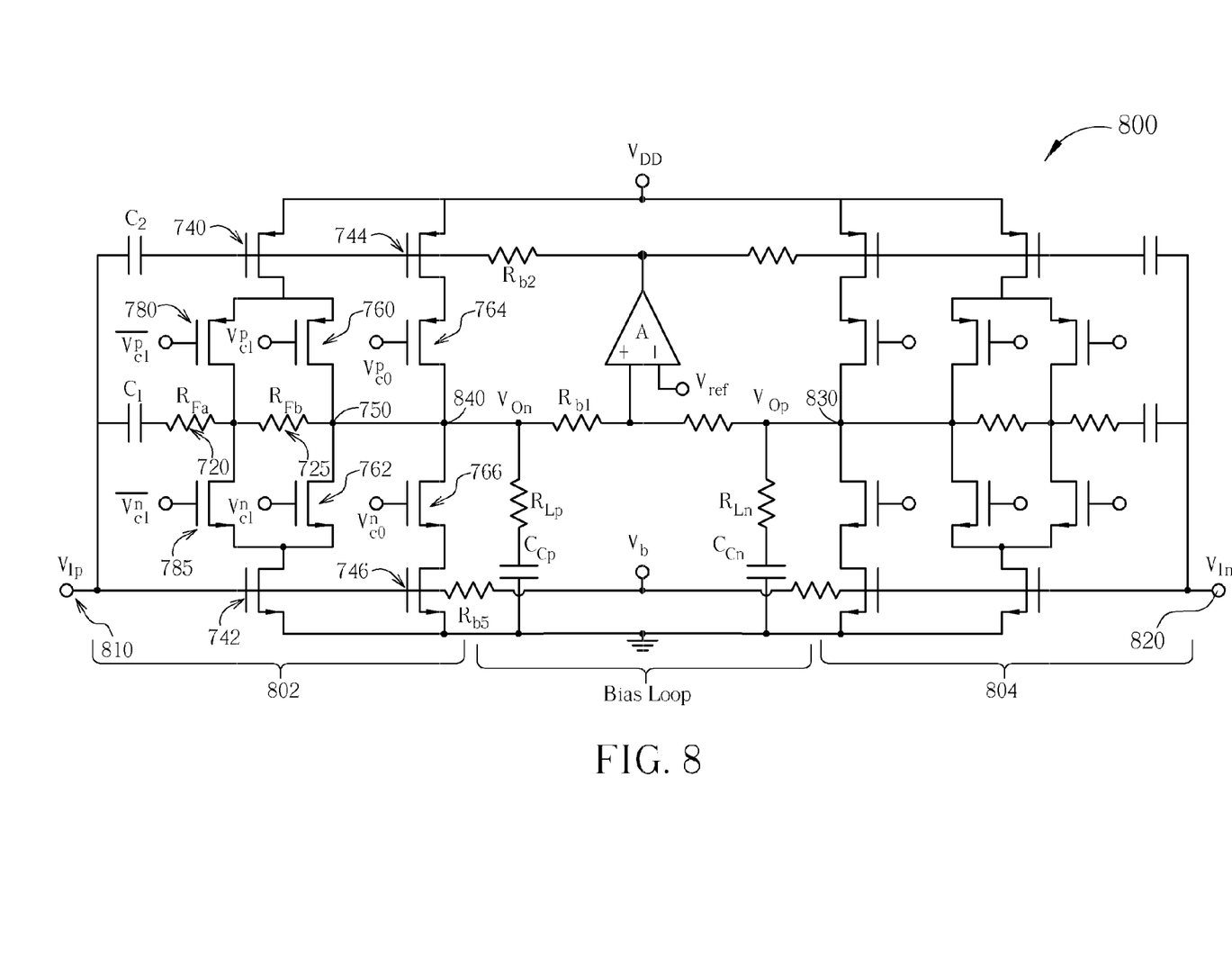
FIG. 8 illustrates an example of another amplifier circuit adapted according to some embodiments of the invention.

As shown in FIG. 8, the pseudo-differential amplifier 800 is realized by using two single-ended amplifiers as the ones depicted in FIG. 7 in parallel, where one amplifier acts as a positive half-circuit 802 and is connected to the positive input node 810, and the other amplifier acts as a negative half-circuit 804 and is connected to the negative input node 820. More specifically, the negative half-circuit 804 may be regarded as a mirror image of the positive input node 810, and each of the positive half-circuit 802 and the negative half-circuit 804 has an amplifier architecture identical to that of the amplifier circuit 700 shown in FIG. 7. Besides, compared to the use of two independent amplifiers, a slight improvement can be achieved by the pseudo-differential amplifier 800 which combines the output common-mode loops of the two amplifiers. As a skilled artisan can readily understand operation and associated advantage/benefit of the positive half-circuit 802 and the negative half-circuit 804 after reading above paragraphs directed to the amplifier circuit 700 shown in FIG. 7, further description is omitted here for brevity.

Figure 9:
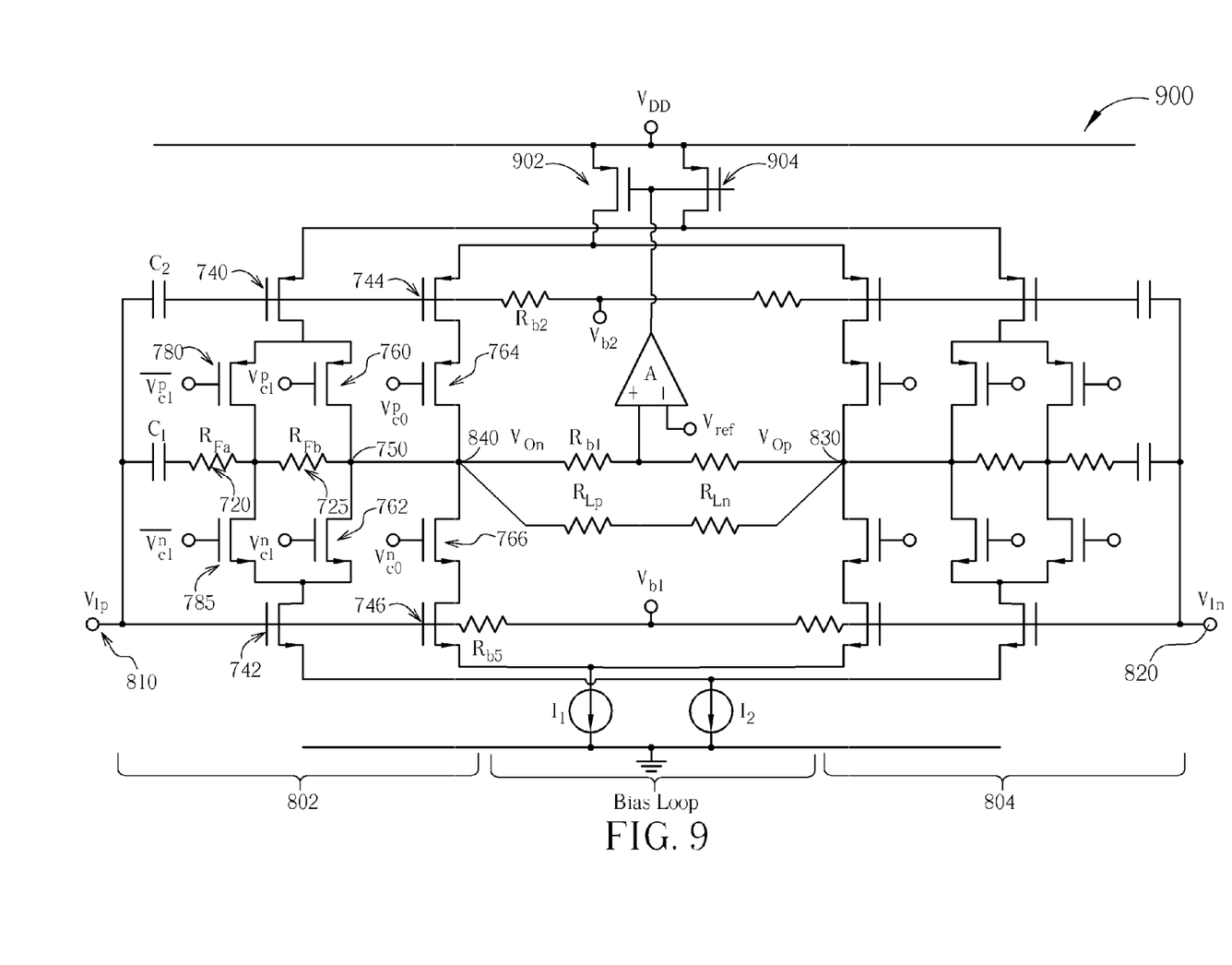
FIG. 9 illustrates an example of yet another amplifier circuit adapted according to some embodiments of the invention.

Please refer to FIG. 9, which illustrates an exemplary embodiment of a fully-differential amplifier 900. By way of example, but not limitation, the exemplary fully-differential amplifier 900 may be a fully-differential implementation of the LNA. In this exemplary fully-differential implementation, the fully-differential amplifier 900 may be obtained by replacing the pseudo-differential transconductors of the pseudo-differential amplifier 800 shown in FIG. 8 with fully-differential ones. More specifically, as shown in FIG. 9, two transistors 902 and 904 acting as current sources and two current sources $I_1$ and $I_2$ are included in the fully-differential amplifier 900. In this way, the positive half-circuit 802 and the negative half-circuit 804 shown in FIG. 9 operate in a fully-differential manner.

The main differences between the pseudo-differential amplifier 800 and the fully-differential amplifier 900 are common-mode loop and low-gain mode forward transconductance. Regarding the common-mode loop, the output common-mode loop error signal in the pseudo-differential amplifier 800 is applied at gates of the transistors 740 and 744; however, in the fully-differential amplifier 900, it is applied to gates of the transistors 902 and 904 acting as current sources whose currents are regulated to match $I_1$ and $I_2$ respectively. The gates of the transistors 740 and 744 may be biased at a fixed suitable voltage. Regarding the low-gain mode forward transconductance, the forward transconductance in a low gain mode of the pseudo-differential amplifier 800 is reduced by grounding the gate of the transistor 766 and connecting to supply the gate of the transistor 764; however, in the fully-differential amplifier 900, on top of that, it is necessary to disable the current source $I_1$ as well. This is easily achieved with the help of a transistor switch (not shown).

To put it simply, regarding each feedback resistance that is located within feedback loops in a positive half-circuit and a negative half-circuit of the pseudo-differential/fully-differential amplifier circuitry, a resistive value of the feedback resistance may be reduced by an amount $\Delta R_F$ for low gain settings. Additionally, that part of the feedback resistance that is no longer present within the feedback loop becomes coupled in series with a load resistance for the amplifier circuitry, and as such the effective load resistance becomes increased by a corresponding amount, namely $\Delta R_F$. Accordingly, by shifting the points along the feedback resistances at which the transconductance currents are injected respectively, the gain of the pseudo-differential/fully-differential amplifier circuitry may be varied in a controllable manner. Besides, the transconductance circuitry in the positive half-circuit and the negative half-circuit of the pseudo-differential/fully-differential amplifier may be arranged to adjust the transconductance of the amplifier circuit by disabling part of the forward transconductance as just explained, such that a substantially constant input impedance of the pseudo-differential/fully-differential amplifier circuit may be maintained.

As mentioned above, the gain of an amplifier circuit, such as that illustrated in FIG. 6, is a function of both the feedback resistance and the load resistance, along with the transconductance provided by the transconductance circuitry. Similarly, regarding the pseudo-differential/fully-differential amplifier circuit 800/900, one transconductance circuitry included in the positive half-circuit 802 is configured to adjust a point along one feedback resistance at which a transconductance current provided by the transconductance circuitry is injected and another transconductance circuitry included in the negative half-circuit 804 is configured to adjust a point along another feedback resistance at which another transconductance current provided by the another transconductance circuitry is injected such that a gain of the pseudo-differential/fully-differential amplifier circuit 800/900 is adjusted.

Moreover, the input impedance of an amplifier circuit, such as that illustrated in FIG. 6, is also a function of the feedback resistance, the load resistance, and the transconductance provided by the transconductance circuitry. Thus, the gain of the transconductance circuitry (i.e., the transconductance provided by the transconductance circuitry) may be additionally changed to achieve a substantially constant input impedance of the amplifier circuit. Similarly, regarding the pseudo-differential/fully-differential amplifier circuit 800/900, a gain of the transconductance circuitry included in the positive half-circuit 802 is adjusted together with the point along the feedback resistance at which the transconductance current provided by the transconductance circuit included in the positive half-circuit 802 is injected and a gain of the another transconductance circuitry included in the negative half-circuit 804 is adjusted together with the point along the another feedback resistance at which the another transconductance current provided by the another transconductance circuit included in the negative half-circuit 804 is injected such that an input impedance of the pseudo-differential/fully-differential amplifier circuit 800/900 remains constant.

It is envisaged that the inventive concept is not limited to use within an RF communication unit receiver. It is envisaged that the inventive concept herein described may equally be applied to any application requiring a variable gain amplifier circuit. Furthermore, a skilled artisan will appreciate that in other applications, alternative functions/circuits/devices and/ or other techniques may be used to implement the inventive concept, such as, by way of example, variable gain transimpedance amplifiers (current input, voltage output), variable frequency relaxation-oscillators, etc.

Thus, the hereinbefore examples provide a variable-gain low noise amplifier circuit. In particular, the hereinbefore examples of a variable gain low noise amplifier circuit are capable of providing reduced power consumption in lower gain configurations. Advantageously, the hereinbefore examples further provide an inductor-less amplifier circuit that requires substantially no external matching network components.

In particular, it is envisaged that the aforementioned inventive concept can be applied by a manufacturer to any integrated circuit comprising amplifier circuitry, for example those of the MediaTek™ wireless handset and/or wireless connectivity family of products. It is further envisaged that, for example, a manufacturer may employ the inventive concept in a design of a stand-alone device, such as an integrated front-end circuit, or application-specific integrated circuit (ASIC) and/or any other sub-system element.

It will be appreciated that, for clarity purposes, the above examples have described embodiments of the invention with reference to certain functional units or devices or circuits. However, it will be apparent that any suitable distribution of functionality between different functional units, or devices or circuits, for example with respect to the transconductance circuitry, may be used without detracting from the invention. Hence, references to specific functional units are only to be viewed as references to suitable means for providing the described functionality, rather than indicative of a strict logical or physical structure or organization.

Aspects of the invention may be implemented in any suitable form including hardware, software, firmware or any combination of these. Thus, the elements and components of an embodiment of the invention may be physically, functionally and logically implemented in any suitable way. Indeed, the functionality may be implemented in a single unit, in a plurality of units or as part of other functional units.

Although the invention has been described in connection with some embodiments, it is not intended to be limited to the specific form set forth herein. Rather, the scope of the invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed. In addition, singular references do not exclude a plurality. Thus, references to 'a', 'an', 'first', 'second', etc. do not preclude a plurality.

Thus, an improved amplifier circuit has been described, wherein at least one or more of the aforementioned disadvantages with prior art arrangements has been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit for amplifying a differential input signal received at a first input node and a second input node of the amplifier circuit, the amplifier circuit comprising:
   a first feedback resistance connected between the first input node of the amplifier circuit and a first output node of the amplifier circuit;
   first transconductance circuitry arranged to inject a transconductance current at a point along the first feedback resistance, wherein the first transconductance circuitry is configurable to vary the point along the first feedback resistance where the transconductance current is injected;
   a second feedback resistance connected between the second input node of the amplifier circuit and a second output node of the amplifier circuit; and
   second transconductance circuitry arranged to inject another transconductance current at a point along the second feedback resistance, wherein the second transconductance circuitry is configurable to vary the point along the second feedback resistance where the another transconductance current is injected.

2. The amplifier circuit of claim 1 wherein the first transconductance circuitry is configured to adjust the point along the first feedback resistance at which the transconductance current is injected and the second transconductance circuitry is configured to adjust the point along the second feedback resistance at which the another transconductance current is injected such that a gain of the amplifier circuit is adjusted.

3. The amplifier circuit of claim 2 wherein a gain of the first transconductance circuitry is adjusted together with the point along the first feedback resistance at which the transconductance current is injected and a gain of the second transconductance circuitry is adjusted together with the point along the second feedback resistance at which the another transconductance current is injected such that an input impedance of the amplifier circuit remains constant.

4. The amplifier circuit of claim 1 wherein each of the first transconductance circuitry and the second transconductance circuitry uses a complementary stage arrangement.

5. The amplifier circuit of claim 4 wherein each of the first transconductance circuitry and the second transconductance circuitry comprises: a first complementary stage and at least one further complementary stage where the transconductance circuitry is arranged to inject a first transconductance current provided by said first complementary stage at a first point along a corresponding feedback resistance.

6. The amplifier circuit of claim 5 wherein the at least one further complementary stage is arranged to inject an at least one further transconductance current provided by said at least one further complementary stage at an at least one further point along the corresponding feedback resistance.

7. The amplifier circuit of claim 5 wherein the first transconductance current from the first complementary stage is injected into the corresponding feedback resistance byway of a first common-gate transistor stage and at least one further common-gate transistor stage.

8. The amplifier circuit of claim 7 wherein at least one further transconductance current from the at least one further complementary stage is injected into the corresponding feedback resistance by way of at least one still further common-gate transistor stage.

9. The amplifier circuit of claim 5 wherein each complementary stage comprises a pair of complementary metal oxide semiconductor field effect transistors.

10. The amplifier circuit of claim 1 wherein the amplifier circuit is adapted for use in a broadband radio frequency front-end circuit.

11. The amplifier circuit of claim 1 wherein the amplifier circuit is a pseudo-differential amplifier or a fully-differential amplifier.

12. An integrated circuit comprising an amplifier circuit for amplifying a differential input signal received at a first input node and a second input node of the amplifier circuit, the amplifier circuit comprising:
   a first feedback resistance connected between the first input node of the amplifier circuit and a first output node of the amplifier circuit;
   first transconductance circuitry arranged to inject a transconductance current at a point along the first feedback resistance, wherein the first transconductance circuitry is configurable to vary the point along the first feedback resistance where the transconductance current is injected;
   a second feedback resistance connected between the second input node of the amplifier circuit and a second output node of the amplifier circuit; and
   second transconductance circuitry arranged to inject another transconductance current at a point along the second feedback resistance, wherein the second transconductance circuitry is configurable to vary the point along the second feedback resistance where the another transconductance current is injected.

13. The integrated circuit of claim 12 wherein the first transconductance circuitry is configured to adjust the point along the first feedback resistance at which the transconductance current is injected and the second transconductance circuitry is configured to adjust the point along the second feedback resistance at which the another transconductance current is injected such that a gain of the amplifier circuit is adjusted.

14. The integrated circuit of claim 13 wherein a gain of the first transconductance circuitry is adjusted together with the point along the first feedback resistance at which the transconductance current is injected and a gain of the second transconductance circuitry is adjusted together with the point along the second feedback resistance at which the another transconductance current is injected such that an input impedance of the amplifier circuit remains constant.

15. The integrated circuit of claim 12 wherein each of the first transconductance circuitry and the second transconductance circuitry uses a complementary stage arrangement.

16. The integrated circuit of claim 15 wherein each of the first transconductance circuitry and the second transconductance circuitry comprises: a first complementary stage and at least one further complementary stage where the transconductance circuitry is arranged to inject a first transconductance current provided by said first complementary stage at a first point along a corresponding feedback resistance.

17. The integrated circuit of claim 16 wherein the at least one further complementary stage is arranged to inject an at least one further transconductance current provided by said at least one further complementary stage at an at least one further point along the corresponding feedback resistance.

18. The integrated circuit of claim 16 wherein the first transconductance current from the first complementary stage is injected into the corresponding feedback resistance byway of a first common-gate transistor stage and at least one further common-gate transistor stage.

19. The integrated circuit of claim 12 wherein the amplifier circuit is a pseudo-differential amplifier or a fully-differential amplifier.

20. A radio frequency communication unit comprising an amplifier circuit for amplifying a differential input signal received at a first input node and a second input node of the amplifier circuit, the amplifier circuit comprising:
- a first feedback resistance connected between the first input node of the amplifier circuit and a first output node of the amplifier circuit;
- first transconductance circuitry arranged to inject a transconductance current at a point along the first feedback resistance, wherein the first transconductance circuitry is configurable to vary the point along the first feedback resistance where the transconductance current is injected;
- a second feedback resistance connected between the second input node of the amplifier circuit and a second output node of the amplifier circuit; and
- second transconductance circuitry arranged to inject another transconductance current at a point along the second feedback resistance, wherein the second transconductance circuitry is configurable to vary the point along the second feedback resistance where the another transconductance current is injected.

21. The radio frequency communication unit of claim 20 wherein the first transconductance circuitry is configured to adjust the point along the first feedback resistance at which the transconductance current is injected and the second transconductance circuitry is configured to adjust the point along the second feedback resistance at which the another transconductance current is injected such that a constant input impedance of the amplifier circuit is maintained.

22. The radio frequency communication unit of claim 20 wherein each of the first transconductance circuitry and the second transconductance circuitry uses a complementary stage arrangement.

23. The radio frequency communication unit of claim 22 wherein each of the first transconductance circuitry and the second transconductance circuitry comprises:
- a first complementary stage and at least one further complementary stage where the transconductance circuitry is arranged to inject a first transconductance current provided by said first complementary stage at a first point along a corresponding feedback resistance.

24. The radio frequency communication unit of claim 23 wherein the at least one further complementary stage is arranged to inject an at least one further transconductance current provided by said at least one further complementary stage at an at least one further point along the corresponding feedback resistance.

25. The radio frequency communication unit of claim 20 wherein the amplifier circuit is a pseudo-differential amplifier or a fully-differential amplifier.

* * * * *